US006278134B1

(12) United States Patent
Capasso et al.

(10) Patent No.: US 6,278,134 B1
(45) Date of Patent: Aug. 21, 2001

(54) BI-DIRECTIONAL UNIPOLAR SEMICONDUCTOR LIGHT SOURCE

(75) Inventors: Federico Capasso, Westfield; Alfred Yi Cho, Summit; Claire F. Gmachl, Millburn; Albert Lee Hutchinson, Piscataway; Deborah Lee Sivco, Warren; Alessandro Tredicucci, Summit, all of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/316,618

(22) Filed: May 21, 1999

(51) Int. Cl.⁷ .................................................. H01L 33/00
(52) U.S. Cl. ................................ 257/96; 257/94; 257/98; 257/190; 327/43; 327/44; 327/45; 327/46; 327/50; 327/96
(58) Field of Search ................................ 372/43–46, 50, 372/96; 257/94, 96, 97, 190

(56) References Cited

U.S. PATENT DOCUMENTS

| | | |
|---|---|---|
| 5,457,709 | 10/1995 | Capasso et al. . |
| 5,509,025 | * 4/1996 | Capasso et al. ...................... 372/45 |
| 5,570,386 | * 10/1996 | Capasso et al. ...................... 372/46 |
| 5,936,989 | * 8/1999 | Capasso et al. ...................... 372/45 |

OTHER PUBLICATIONS

Yang, Zhang, Yang Lin, Murry, Pei "Mid–infrared Interband Cascade Lasers With Quantum Efficiencies >200%" Applied Physics Letters vol. 72, No. 18, May 4, 1998.

Faist, Capasso, Sirtori, Sivco, Hutchinson, Cho "Laser Action by Tuning the Oscillator Strength"Nature, vol. 387, Jun. 19, 1997.

Tredicucci, Gmachl, Capasso, Sivco, Hutchinson & Cho, "A Multiwavelength Semiconductor Laser" Nature, vol. 396, Nov. 26, 1998.

Gmachl, Tredicucci, Capasso, Hutchinson, Sivco, Baillargeon, Cho "High–Power $\lambda \approx 8$ $\mu$m Quantum Cascade Lasers with Near Optimum Performance" Applied Physics Letters, vol. 72, No. 24, Jun. 15, 1998.

* cited by examiner

Primary Examiner—Olik Chaudhuri
Assistant Examiner—Wai-Sing Louie

(57) ABSTRACT

A bi-directional semiconductor light source is formed that provides emission in response to either a positive or negative bias voltage. In a preferred embodiment with an asymmetric injector region in a cascade structure, the device will emit at a first wavelength ($\lambda^-$) under a negative bias and a second wavelength ($\lambda^+$) under a positive bias. In other embodiments, the utilization of an asymmetric injector region can be used to provide a light source with two different power levels, or operating voltages, as a function of the bias polarity.

16 Claims, 3 Drawing Sheets

POSITIVE BIAS

NEGATIVE BIAS

BI-DIRECTIONAL UNIPOLAR SEMICONDUCTOR LIGHT SOURCE

GOVERNMENT CONTRACTS

This invention was made with Government support under contract No. DAAG55-98-0050 awarded by the DARPA/US Army Research Office. The Government has certain rights in this invention.

FIELD OF THE INVENTION

This application pertains to the field of cascade semiconductor light sources and, more particularly, to light sources capable of operation under either a positive or negative applied bias voltage ("bi-directional").

BACKGROUND OF THE INVENTION

Cascade semiconductor light sources, in particular, quantum cascade (QC) lasers have been used extensively as mid-infrared sources since their development in the mid-1990's. A detailed account of a preliminary QC laser can be found in U.S. Pat. No. 5,509,025 entitled "Unipolar Semiconductor Laser" issued to F. Capasso et al. on Apr. 16, 1996. In Capasso et al., a QC laser is described that comprises a multilayer semiconductor structure having a multiplicity of essentially identical undoped "active" regions, a given active region being separated from an adjoining one by a doped "energy injection/relaxation" region, which often (for ease of language hereinbelow) is referred to as an "injector" region. In one embodiment, each active region may comprise three coupled quantum wells (QWs) designed to facilitate attainment of population inversion (of course, the use of three QWs is exemplary only, various other structures may be formed to include any desired number of coupled quantum wells). Associated with the coupled wells are at least two (preferably more) energy states with predetermined wavefunctions. In particular, a wavefunction is "associated" with an energy state in a certain well if the centroid of the modulus square of the wavefunction is in this well. The energy injection/relaxation regions are generally selected: (1) to provide substantial energy relaxation and randomization of motion of charge carriers of the given conductivity type in a given graded energy injection/relaxation region when a normal operating voltage is applied; and (2) to inject the charge carriers into the upper laser state of the following active region optical transition.

There are a number of advantages associated with the QC laser structure that have already been recognized by those skilled in the art. Among these are the ability to tailor the emission wavelength, which is discussed below, the high optical power output resulting from the ability to stack (i.e., "cascade") many (stacks from 1–75 have been demonstrated to date) active regions alternated with injection/relaxation regions such that electrons are recycled and emit as many photons as there are active regions in the stack, and the intrinsic reliability of the QC laser structure resulting from the use of well-understood III-V semiconductor materials and the lack of high energy inter-band relaxation mechanisms. Additionally, QC lasers are expected to have a frequency response that is not limited by electron/hole recombination, a narrow emission line because the linewidth enhancement factor is (theoretically) zero, and a weaker temperature dependence of the lasing threshold than in conventional (i.e., bipolar) semiconductor lasers. The lasers can have an emission wavelength in the spectral region from the mid-infrared (mid-IR) to the submillimeter region (e.g., 3–100 $\mu$m) that is entirely determined by quantum confinement. Advantageously, the emission wavelength within this region can be tailored by controlling the size of the wells and barriers without modifying the composition of the laser structure (the composition being the conventional GaAs- or InP-based material systems). As an alternative, however, the composition may be designed away from a lattice-matched structure in order to achieve higher conduction band discontinuities, a particular interest for short wavelength devices (e.g., $\lambda < 5$ $\mu$m).

Similar to conventional bipolar semiconductor lasers, the QC laser structures developed thus far have generally been limited to emitting at a single wavelength, or a narrow wavelength range around a single center wavelength. There are many applications, such as trace-gas analysis, where multiwavelength sources are desired. In particular, the availability of a dual-wavelength laser would greatly simplify and improve the use of these sources in differential techniques relying on laser pulses of two different wavelengths (one resonant with an absorption line of the target gas and the other off-resonant); one example of such a technique is differential absorption LIDAR (light detection and ranging)—one of the most sensitive spectroscopic methods of pollution monitoring. An article entitled "A multiwavelength semiconductor laser" by A. Tredicucci et al. appearing in *Nature*, Vol. 396 Nov. 26, 1998 at pp. 350–353 discusses a semiconductor laser structure including specific tailoring of the electronic states and electron relaxation times in the superlattice layered structure to achieve several distinct optical transitions (e.g., 6.6., 7.3 and 7.9 $\mu$m). A tunable QC laser exhibiting dual-wavelength operation at threshold is discussed in an article entitled "Laser Action by Tuning the Oscillator Strength" J. Faist et al., appearing in *Nature*, Vol. 387, pp. 777 et seq., 1997. In this case, the two optical transitions originated from separate sections of the same material, biased at different voltages, to obtain two wavelengths via the Stark effect. The wavelengths available with these approaches, however, are limited by the material properties and design of the device or the responsiveness of the device to the applied voltage.

SUMMARY OF THE INVENTION

The present invention discloses a unipolar cascade light source that exhibits different characteristics as a function of the polarity of the applied voltage (the "different characteristics may comprise, for example, an emission wavelength which is dependent upon the polarity of the applied bias voltage, a polarity-dependent output power or operating voltage, etc.). In particular, a unipolar light source structure is formed that is capable of generating a first emission wavelength ($\lambda^+$) under a positive bias supply voltage and a second emission wavelength ($\lambda^-$) under a negative bias supply voltage.

In accordance with a preferred embodiment of the present invention, the quantum wells and barriers of a cascade light source injector region are asymmetrically designed to provide a dual-wavelength characteristic. That is, by providing an asymmetric barrier/well structure around a common laser ground state located in the active region, different $\lambda^+$ and $\lambda^-$ wavelengths will be generated under positive applied bias and negative applied bias, respectively. Advantageously, these wavelengths may be made as close as desired, since they are generated at different times and by opposing bias voltages. In the limit, the same wavelength can be generated by opposite polarity supply voltages (more as an illustration of how close the wavelengths can be as opposed to having a practical application).

The bi-directional laser structure of the present invention is equally applicable to cascade laser arrangements other than the quantum cascade laser. In particular, the so-called "type-II" quantum cascade laser can be modified to include an asymmetric band structure so as to exhibit the bi-directional qualities described above.

Other and further characteristics and embodiments of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
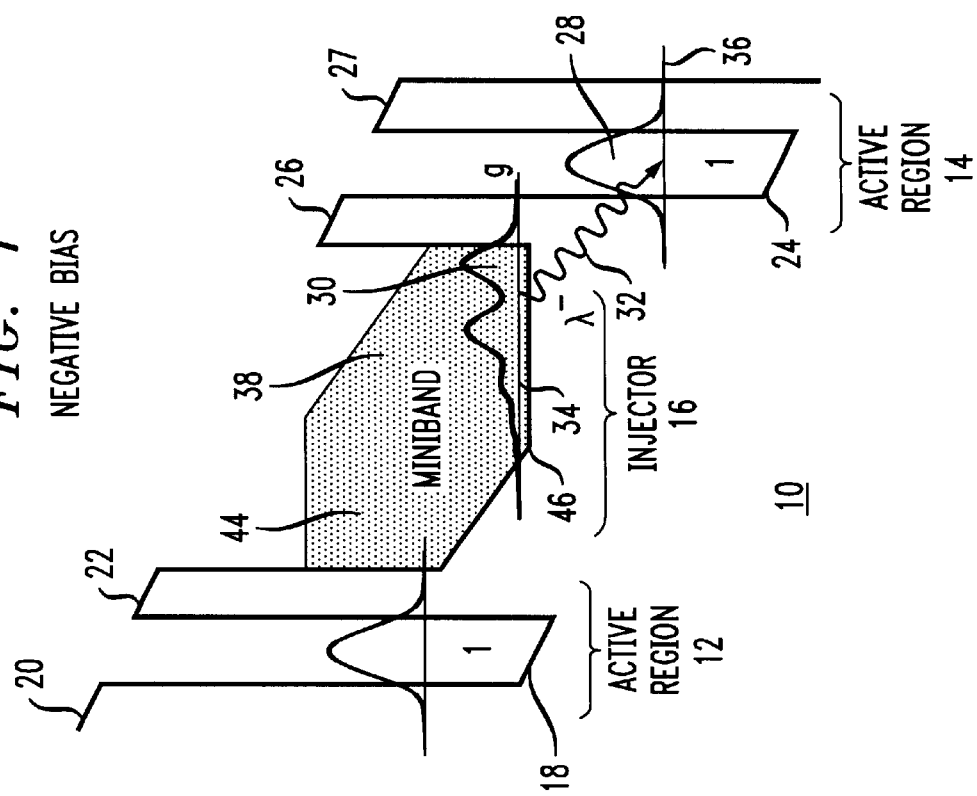
FIG. 1 contains a schematic diagram of a portion of the conduction band of a bi-directional QC laser of the present invention under a negative bias voltage.

FIG. 1 contains a schematic diagram of a portion of the conduction band of an exemplary QC laser 10 in accordance with the present invention. The depicted portion illustrates a first active region 12 and a second active region 14 separated by an injector region 16. As shown, the combination of an active region and an injector region define one period of a multi-period QC structure (typical structures may comprise, for example twenty-five periods). In the specific embodiment of FIG. 1, first active region 12 is formed to include a single quantum well 18 disposed between a pair of barrier layers 20,22. Quantum well 18 may comprise $Ga_{0.47}In_{0.53}As$ (hereinafter referred to simply as "GaInAs") and barriers 20,22 may comprise $Al_{0.48}In_{0.52}As$ (hereinafter referred to simply as "AlInAs"). Other material systems (such as strained or strain-compensated InP-based systems, GaAs-based systems, quarternary systems, or GaN-based systems, and others) may also be used. Second active region 14 similarly includes a single GaInAs quantum well 24 disposed between a pair of AlInAs barriers 26,27. The single well structures shown in FIG. 1 are considered to be exemplary of an embodiment that is relatively easy to design—as well as instructional—and are shown as such for the sake of clarity, as well. It is to be understood that active regions may comprise any desired number of wells and barriers. Injector region 16, as shown, is formed to exhibit a "miniband" structure, comprising a manifold of energy levels with a ground level, g, as shown. As an example, injector region 16 may comprise six quantum wells with interleaving barriers, using the same materials as used for active regions 12,14. FIG. 1 depicts only the effective band edge of injector region 16 for the sake of simplicity.

In accordance with the present invention, dual wavelength operation is achieved by applying either a negative bias or a positive bias to a structure including an asymmetric injector region 16. "Asymmetric" injection region 16 is defined herein as an injector region including a first section 38 and a second section 44 disposed on either side of a center point 46, where the thicknesses or doping (or both) of the barriers and wells forming first section 38 differ from the barriers and wells forming second section 44. It is to be noted that "center point 46" appears to shift in location between the illustrations of FIG. 1 and FIG. 2, with the shift depending on the magnitude of the applied bias. Therefore, "center point" can be interpreted as the true center within the number of barriers and wells forming the injector region, the half-width point in the total length of the injector, or the extension of the respective ground state wavefunction in each bias. In most cases, all three definitions of "center point" will result in locations extremely close to each other, and all are considered to fall within the spirit and scope of the present invention. Referring back to FIG. 1, this illustrates in particular the situation where a negative bias is applied to laser 10, where the application of this negative bias creates the "diagonal" structure with first active region 12 being drawn "above" injector region 16 and second active region 14 being "below" injector region 16. The terms "above" and "below" are considered to be descriptive in as much as electrons move through the structure from top to bottom (in either bias). The moduli squared 28 of the wavefunction of active region 14 and the moduli squared 30 of the injector ground state are also shown in FIG. 1. In accordance with the present invention, emission will occur in the presence of the negative bias, as indicated by wavy line 32, between the ground state 34 of injector region 16 and an exemplary energy state 36 of second active region 14. The emission, designated $\lambda^-$, will occur at a wavelength determined by the relative sizes of the barriers and wells forming section 38 of asymmetric injector region 16. As will be discussed below in association with FIG. 4, a $\lambda^- \approx 6.5\ \mu m$ has been achieved with a structure such as that shown in FIG. 1.

Figure 2:
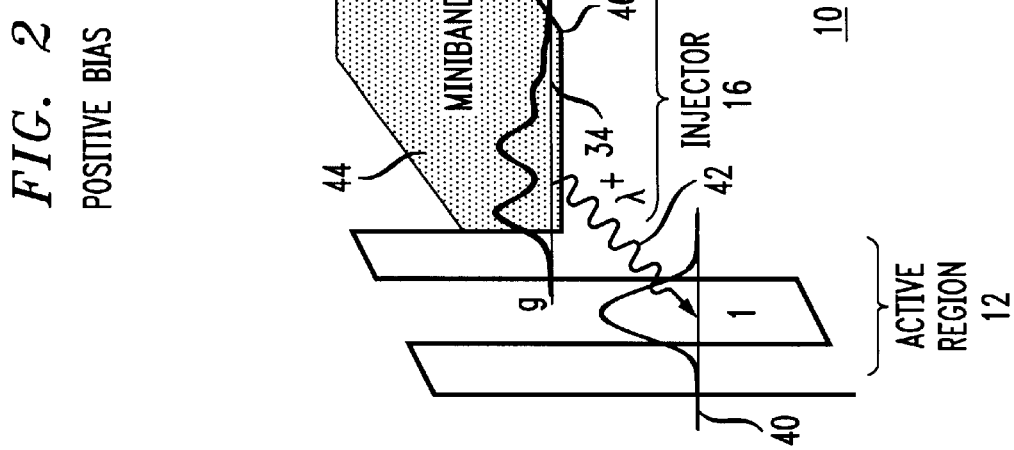
FIG. 2 contains a schematic diagram of the same conduction band as shown in FIG. 1, under a positive bias voltage.

A positive bias applied to laser structure 10 results in an arrangement as shown in FIG. 2 with second active region 14 being drawn "above" injector region 16 and first active region 12 being "below" injector region 16. With the application of a positive bias, emission will occur between ground state 34 of injector region 16 and energy state 40 of first active region 12, shown by wavy line 42. In accordance with the present invention, the emission at $\lambda^+$ will occur at a wavelength determined by the relative sizes of the barriers and wells forming section 44 of asymmetric injector region. Accordingly, the formation of an asymmetric structure about a center point 46 of injector region 16 results in forming a dual wavelength structure in accordance with the present invention. As will be discussed below in association with FIG. 4, a $\lambda^+ \approx 6.35\ \mu m$ has been achieved.

As is well-understood in the field of quantum cascade lasers, a "repeating" cascade structure may include any desired number of periods (that is, N periods of alternating "active" and "injector" regions), where the "first active region" as depicted in FIGS. 1 and 2 would be the "second" active region for the previous period, and the "second" would be the "first" for the next period, under negative bias, and vice versa for positive bias. However, it is equally well-understood that a "single stage" bi-directional laser may be formed in accordance with the teachings of the present invention, including a single active region, clad on each side by an injector region, the injector regions being "different" for an asymmetric structure and "equal" for a symmetric structure.

Since the particular wavelengths are a function of physical characteristics of sections 38 and 44 of injector region 16, the $\lambda^-$ and $\lambda^+$ values can be individually tailored to be as close to one another (or as widely separated) as applicable for any particular situation. In some applications, it is desired to provide two wavelengths that are extremely close together in value. Such a need can be fulfilled with the structure of the present invention, since, at the limit, an essentially identical wavelength can be produced under each bias by forming a symmetric injector region 16 about center point 46.

EXAMPLE I

Voltage-symmetric, Stark-tunable QC Laser

This example describes a Group III–V compound semiconductor bi-directional QC laser in accordance with one embodiment (symmetric injector region) of the present invention. Various materials, dimensions and operating conditions are provided by way of illustration only and, unless otherwise expressly stated, are not intended to limit the scope of the invention. As used herein, the term undoped means that a particular semiconductor layer or region is not intentionally doped; i.e., any doping of such a region or layer is relatively low and typically results from residual or background doping in the molecular beam epitaxy chamber used to grow the layers of the device. The "injector" portion of the QC structure is indicated in bold typeface, and may be repeated—alternated with active regions including the two injection barriers—any desired number of times within the stack of layers forming the structure (a stack of "35" periods of this injector region may be used in a preferred embodiment, for example). The center point of symmetry within the injector structure is indicated in bold italics in Table 1.

TABLE 1

| QC Laser Structure D2476 | Composition | Doping Concentration (cm$^{-3}$) | Thickness (Å) |
|---|---|---|---|
| Contact facilitating | GaInAs (Sn) | n = 1 × 10$^{20}$ | 100 |
| Cladding | GaInAs | n = 7 × 10$^{18}$ | 7000 |
| Cladding | Ga$_{0.5x}$Al$_{(1-x)}$InAs grading V | n = 2 × 10$^{17}$ | 250 |
| Cladding | AlInAs | n = 2 × 10$^{17}$ | 11000 |
| Cladding | AlInAs | n = 1 × 10$^{17}$ | 15000 |
| Cladding | GaInAs | n = 5 × 10$^{16}$ | 4000 |
|  | AlInAs (undoped) |  | 35 |
| Single well active region | GaInAs (undoped) |  | 48 |
| Positive pol. injection barrier | AlInAs (undoped) |  | 35 |
| Injector | GaInAs (undoped) |  | 24 |
| Injector | AlInAs (undoped) |  | 25 |
| Injector | GaInAs (undoped) |  | 26 |
| Injector | AlInAs | n = 3 × 10$^{17}$ | 15 |
| Injector | *GaInAs* | *n = 3 × 10$^{17}$* | *22* |
| Injector | AlInAs | n = 3 × 10$^{17}$ | 10 |
| Injector | GaInAs | n = 3 × 10$^{17}$ | 22 |
| Injector | AlInAs | n = 3 × 10$^{17}$ | 15 |
| Injector | GaInAs | n = 3 × 10$^{17}$ | 26 |
| Injector | AlInAs (undoped) |  | 25 |
| Injector | GaInAs (undoped) |  | 24 |
| Negative Pol. | AlInAs (undoped) |  | 35 |

TABLE 1-continued

| QC Laser Structure D2476 | Composition | Doping Concentration (cm$^{-3}$) | Thickness (Å) |
|---|---|---|---|
| Injection Barrier |  |  |  |
|  | GaInAs (undoped) |  | 48 |
|  | AlInAs (undoped) |  | 35 |
| Cladding | GaInAs | n = 5 × 10$^{16}$ | 6000 |
| Cladding | Ga$_{0.5x}$Al$_{0.5(1-x)}$InAs grading I | n = 1 × 10$^{17}$ | 250 |
| Substrate | InP | n = 1 – 4 × 10$^{17}$ | — |

EXAMPLE II

Voltage Asymmetric, Stark-tunable

This second example describes a Group III-V compound semiconductor bi-directional QC laser in accordance with an alternative embodiment (asymmetric injector region) of the present invention. Various materials, dimensions and operating conditions are provided by way of illustration only and, unless otherwise expressly stated, are not intended to limit the scope of the invention. As used herein, the term undoped means that a particular semiconductor layer or region is not intentionally doped; i.e., any doping of such a region or layer is relatively low and typically results from residual or background doping in the chamber used to grow the layers of the device. The "injector" portion of the QC structure is indicated in bold typeface, and may be repeated—alternated with active regions including the two injection barriers—any desired number of times within the stack of layers forming the structure (a stack of "35" periods of this injector region may be used in a preferred embodiment, for example). The center point between the two asymmetric injector sections is indicated in bold italics in Table 2.

TABLE 2

| QC Laser Structure D2520 | Composition | Doping Concentration (cm$^{-3}$) | Thickness (Å) |
|---|---|---|---|
| Contact facilitating | GaInAs (Sn) | n = 1 × 20$^{20}$ | 100 |
| Cladding | GaInAs | n = 7 × 10$^{18}$ | 7000 |
| Cladding | Ga$_{0.5x}$Al$_{(1-x)}$InAs grading V | n = 2 × 10$^{17}$ | 250 |
| Cladding | AlInAs | n = 2 × 10$^{17}$ | 11000 |
| Cladding | AlInAs | n = 1 × 10$^{17}$ | 15000 |
| Cladding | GaInAs | n = 5 × 10$^{16}$ | 4000 |
|  | AlInAs (undoped) |  | 35 |
| Single well active region | GaInAs (undoped) |  | 48 |
| Positive pol. injection barrier | AlInAs (undoped) |  | 35 |
| Injector | GaInAs (undoped) |  | 22 |
| Injector | AlInAs (undoped) |  | 29 |
| Injector | GaInAs (undoped) |  | 22 |
| Injector | AlInAs | n = 4 × 10$^{17}$ | 19 |
| Injector | GaInAs | n = 4 × 10$^{17}$ | 22 |
| Injector | AlInAs | n = 4 × 10$^{17}$ | 10 |
| Injector | GaInAs | n = 4 × 10$^{17}$ | 22 |
| Injector | AlInAs | n = 4 × 10$^{17}$ | 15 |
| Injector | GaInAs | n = 4 × 10$^{17}$ | 26 |
| Injector | AlInAs (undoped) |  | 25 |
| Injector | GaInAs (undoped) |  | 24 |
| Negative Pol. Injection Barrier | AlInAs (undoped) |  | 35 |
|  | GaInAs (undoped) |  | 48 |
|  | AlInAs (undoped) |  | 35 |
| Cladding | GaInAs | n = 5 × 10$^{16}$ | 6000 |
| Cladding | (Ga$_{0.5x}$Al$_{0.5(1-x)}$)InAs | n = 1 × 10$^{17}$ | 250 |

TABLE 2-continued

| QC Laser Structure D2520 | Composition | Doping Concentration (cm$^{-3}$) | Thickness (Å) |
|---|---|---|---|
| Substrate | grading I InP | n = 1 – 4 × 10$^{17}$ | — |

The digitally graded (DG) regions I, IV and V noted in Tables 1 and 2 above comprise multi-layered structures of alternating GaInAs and AlInAs layers, as is well-known in the art. DG regions IV and V are uniformly doped from layer to layer, but DG region I includes a top set of seven layers that are undoped and a bottom set of three layers doped at 1×10$^{17}$ cm$^{-3}$. Non-uniform doping of DG region I, however, is not essential. The composition grading of the DG regions serve to provide a gradual transition between bulk-like material regions (i.e., between the substrate and the lower GaInAs layers, or between the layers of the top waveguide cladding). The structure and composition of cladding DG regions I, IV and V are shown in Tables 3, 4 and 5 below.

TABLE 3

Digital Grading I

| Composition | Doping Concentration (cm$^{-3}$) | Thickness (Å) |
|---|---|---|
| AlInAs (i) | undoped | 5 |
| GaInAs (i) | undoped | 45 |
| AlInAs (i) | undoped | 10 |
| GaInAs (i) | undoped | 40 |
| AlInAs (ii) | undoped | 15 |
| GaInAs (ii) | undoped | 35 |
| AlInAs (ii) | undoped | 20 |
| GaInAs (n-doped) | 1 × 10$^{17}$ | 30 |
| AlInAs (n-doped) | 1 × 10$^{17}$ | 25 |
| GaInAs (n-doped) | 1 × 10$^{17}$ | 25 |

TABLE 4

Digital Grading IV

| Composition | Doping Concentration (cm$^{-3}$) | Thickness (Å) |
|---|---|---|
| GaInAs (n-doped) | 1 × 10$^{17}$ | 8 |
| AlInAs (n-doped) | 1 × 10$^{17}$ | 42 |
| GaInAs (n-doped) | 1 × 10$^{17}$ | 16 |
| AlInAs (n-doped) | 1 × 10$^{17}$ | 34 |
| GaInAs (n-doped) | 1 × 10$^{17}$ | 25 |
| AlInAs (n-doped) | 1 × 10$^{17}$ | 25 |
| GaInAs (n-doped) | 1 × 10$^{17}$ | 34 |
| AlInAs (n-doped) | 1 × 10$^{17}$ | 16 |
| GaInAs (n-doped) | 1 × 10$^{17}$ | 42 |
| AlInAs (n-doped) | 1 × 10$^{17}$ | 8 |

TABLE 5

Digital Grading V

| Composition | Doping Concentration (cm$^{-3}$) | Thickness (Å) |
|---|---|---|
| AlInAs (n-doped) | 2 × 10$^{17}$ | 8 |
| GaInAs (n-doped) | 2 × 10$^{17}$ | 42 |
| AlInAs (n-doped) | 2 × 10$^{17}$ | 16 |
| GaInAs (n-doped) | 2 × 10$^{17}$ | 34 |
| AlInAs (n-doped) | 2 × 10$^{17}$ | 25 |
| GaInAs (n-doped) | 2 × 10$^{17}$ | 25 |
| AlInAs (n-doped) | 2 × 10$^{17}$ | 34 |
| GaInAs (n-doped) | 2 × 10$^{17}$ | 16 |

TABLE 5-continued

Digital Grading V

| Composition | Doping Concentration (cm$^{-3}$) | Thickness (Å) |
|---|---|---|
| AlInAs (n-doped) | 2 × 10$^{17}$ | 42 |
| GaInAs (n-doped) | 2 × 10$^{17}$ | 8 |

Figure 3:
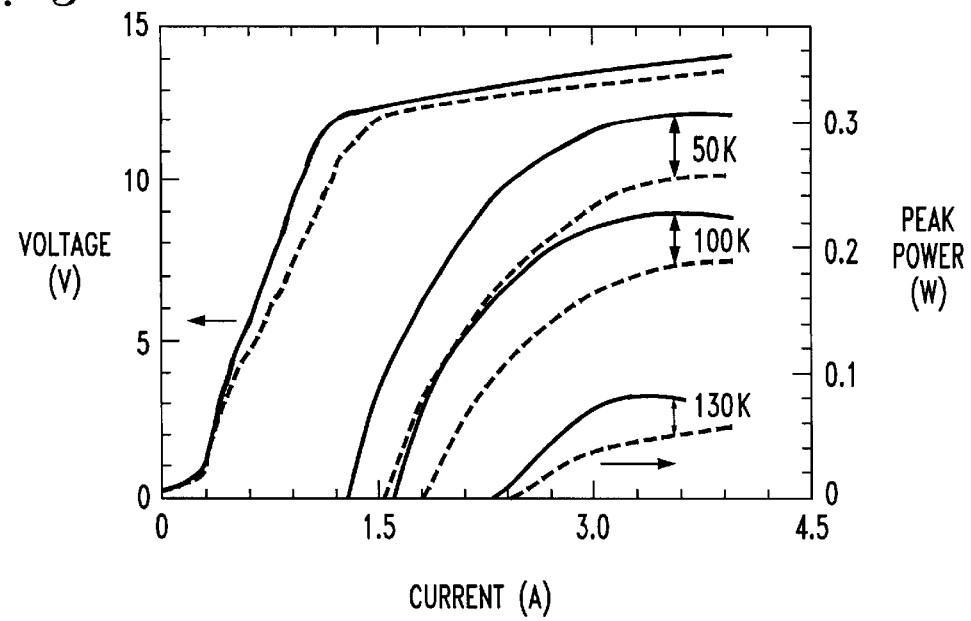
FIG. 3 depicts both the light output and voltage to current characteristics of an exemplary bi-directional QC laser structure, illustrating values for both negative (solid curve) and positive (dashed curve) bias voltages.

FIG. 3 is a graph illustrating both light output (peak power) and voltage as a function of current for an exemplary (symmetric) bi-drectional QC laser formed in accordance with the present invention. The QC laser comprises a length of 3 mm and 13 μm wide ridge waveguide. The various heat sink temperatures of 50K, 100K and 130K associated with the light output measurements are indicated on the graph. The solid lines indicate a negative applied bias and the dashed lines indicate a positive applied bias. As shown, a peak power of approximately 300 mW can be obtained, with a negative bias, in the cryogenic range. A power of slightly less than 100 mW is generated at 130K for both negative and positive bias voltages.

Figure 4:
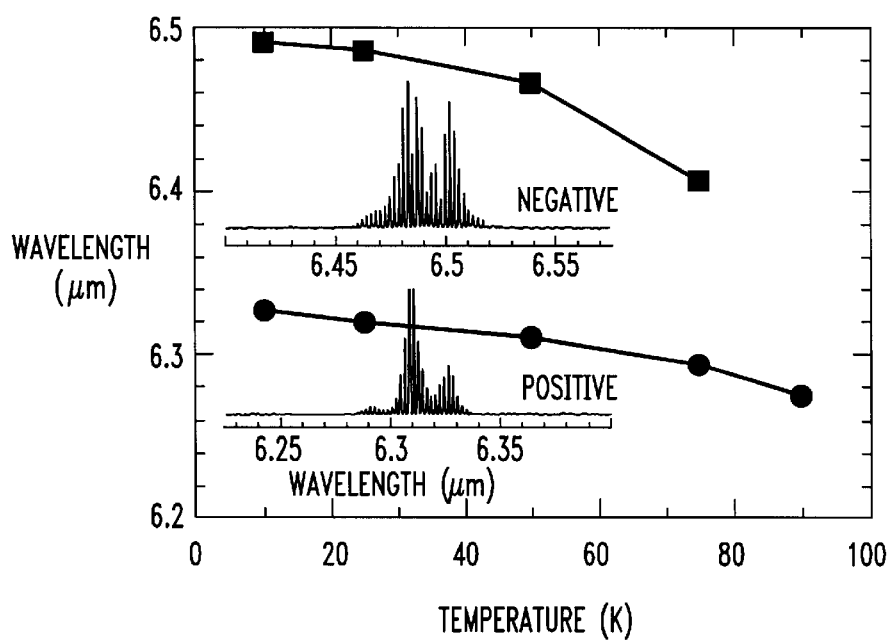
FIG. 4 illustrates peak wavelength as a function of heat sink temperature for both negative and positive bias voltages.

The peak wavelength as a function of heat sink temperature for an exemplary asymmetric QC laser is shown in FIG. 4. The particular QC laser that was studied exhibited, at cryogenic temperatures, a first output $\lambda^-\approx 6.5$ μm (under negative bias) and a second output $\lambda^+\approx 6.35$ μm. The change in +$^-$ is shown by the squares in the graph, with circles used to show the change in $\lambda^+$. The blue-shift of the peak wavelength with increasing temperature is typical for the diagonal design of the active region of the QC laser. The laser is shown to produce a peak output power of $\geq 100$ mW at cryogenic temperatures independent of the bias polarity (and, therefore, wavelength). The insets in FIG. 4 illustrate the laser spectra, for both negative and positive applied bias, at 10K.

Figure 5:
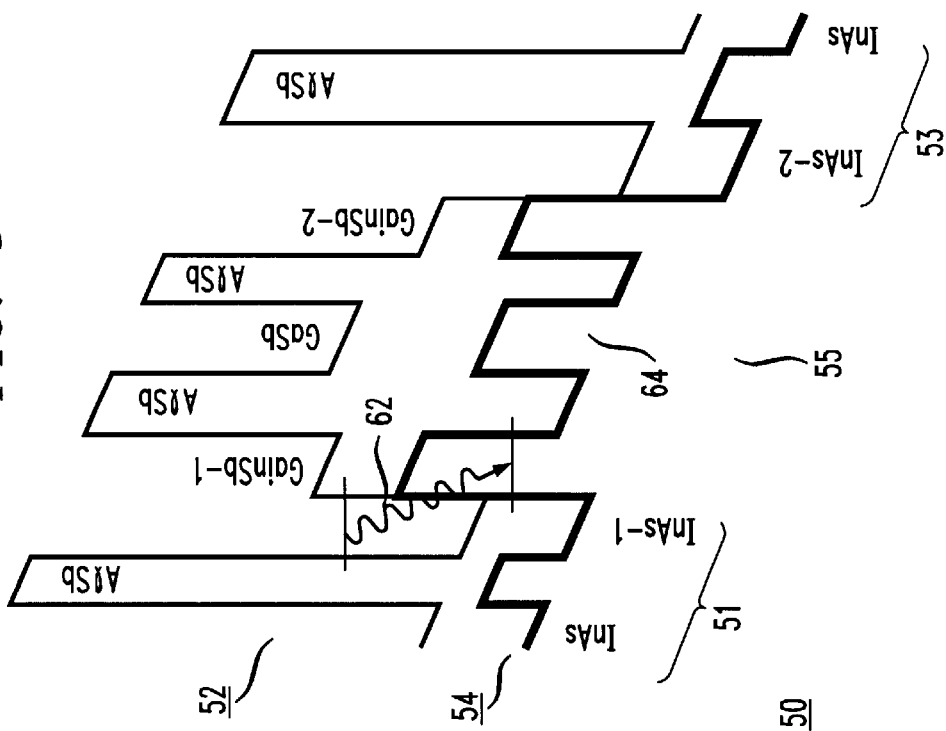
FIG. 5 contains a schematic diagram of a portion of a type-II cascade laser of the present invention under a negative bias voltage.

FIG. 5 contains a schematic diagram of a portion of an exemplary type-II interband cascade laser 50 that exhibits bi-directional characteristics in accordance with the present invention. The illustrated portion includes a pair of active regions 51,53 disposed on either side of an injector region 55. It is to be understood that as with the arrangement discussed above, such an interband cascade laser may be formed to include a plurality of such repeating active/injector periods (as many as 45 repeating periods, for example), noting that lasing action will occur also in an embodiment including a single injection region intermediate a pair of active regions. Cascade laser 50 comprises both a conduction band 52 and valence band 54, and is based on interband transitions in the quantum well structure between the conduction band of quantum well InAs-1 (or InAs-2) and the valence band of quantum well GaInSb-1(or GaInSb-2). As is well known, electrons injected into the conduction band levels of the InAs quantum well relax into the valence band hole levels in the GaInSb well by photon emission, then tunnel into the adjacent GaSb well, then proceed to the next action region 53 via interband tunneling.

Figure 6:
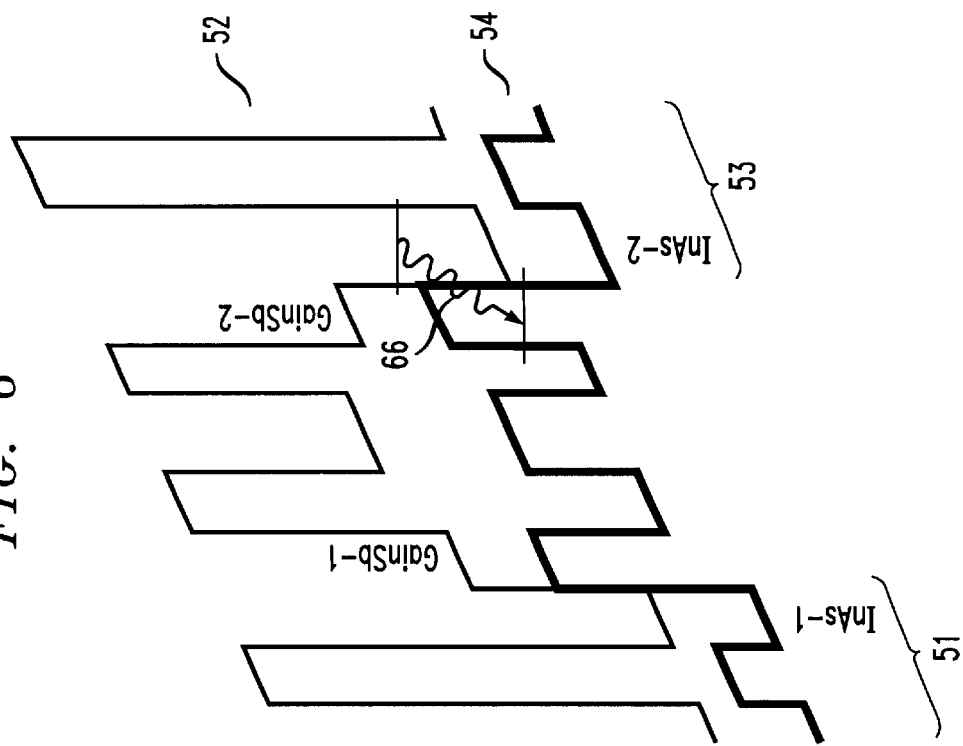
FIG. 6 contains a schematic diagram of the same type-II cascade laser as shown in FIG. 5, under a positive bias voltage.

The portion of cascade laser 50 illustrated in FIG. 5 is shown as affected by a negative bias voltage applied to the structure, such that first active region 51 is drawn "above" injector region 55 and second active region 53 is below injector region 55. The emission, as indicated by wavy line 62, will thus occur between first active region 51 and injector region 55. As a result of the larger band offsets and the interband nature of the transition of the type-II cascade laser, when compared with the QC laser discussed above, the emission will occur at wavelengths around 3–4 μm. In accordance with the teachings of the present invention, injector region 55 may be formed as either a symmetric structure or an asymmetric structure about a center point 64, where the utilization of an asymmetric injector region will result in laser 50 exhibit a dual-wavelength characteristic when biased either negative or positive. A positively-based depiction of type-II cascade laser 50 is shown in FIG. 6, with second active region 53 being drawn "above" injector region 55 and first active region 51 being below injector region 55. In this case, emission will occur, as indicated by wavy line 66 between second active region 53 and injector region 55. In an asymmetric structure, this emission will occur at a different wavelength than that associated with the negatively-biased mode of laser structure 50.

Figure 7:
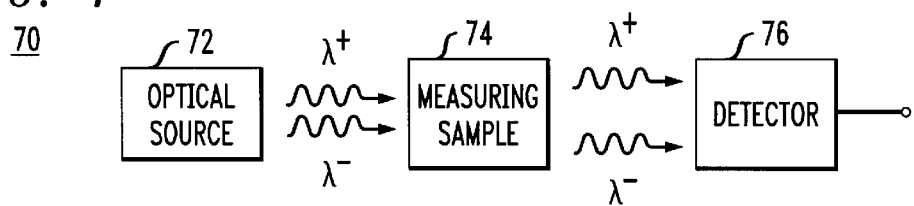
FIG. 7 schematically shows an exemplary measuring apparatus according to an aspect of the present invention.

It is to be understood that the above-described structures are merely illustrative of the many possible specific embodiments which can be devised to represent application of the principles of the invention. Numerous and varied other arrangements can be devised in accordance with these principles by those skilled in the art without departing from the spirit and scope of the invention. In one specific utilization, dual wavelength QC optical sources can be used to determine the absorption of a gaseous sample at wavelengths $\lambda^-$ and $\lambda^+$, for example to determine the concentration of a particular chemical compound in the measurement sample. In a typical application, known as differential spectroscopy, light at one wavelength experiences a different effect (e.g., degree of absorption) in the sample than light at the other wavelength. FIG. 7 schematically shows such a measuring apparatus 70, with numerals 72–76 referring, respectively, to the dual wavelength optical source, sample and detector. The measurement sample can be confined in a measuring cell or may be unconfined. In particular, if the dual wavelength QC laser will be used in high resolution gas sensing applications (or other applications requiring a narrow emission linewidth), it may be advantageous to fabricate the lasers as distributed feedback lasers, with the two gratings formed (in a proper combination) such that each grating is matched to the emission of one polarity of the two-wavelength device.

What is claimed is:

1. A cascade semiconductor light source comprising
   a first active region including alternating undoped barrier and undoped quantum well layers;
   a second active region including alternating undoped barrier and undoped quantum well layers; and
   an injector region disposed between the first and second active regions, said injector region comprising alternating doped barrier layers and doped quantum well layers and defined as including a center point, the application of a first polarity voltage to said light source results in the first active region to be positively biased with respect to the injector region such that the cascade semiconductor light source exhibits a first, predetermined characteristic and the application of a second, opposite polarity voltage to said light source results in the second active region to be positively biased with respect to the injector region such that the cascade light source exhibits a second, predetermined characteristic.

2. A light source as defined in claim 1 wherein the first, predetermined characteristic is defined as emission at an output wavelength $\lambda^-$ and the second, predetermined characteristic is defined as emission at an output wavelength $\lambda^+$.

3. A light source as defined in claim 1 wherein the injector region comprises a symmetric arrangement of barriers and wells about the center point of said injector region such that the first, predetermined characteristic is essentially identical to the second, predetermined characteristic.

4. A light source as defined in claim 2 wherein the injector region comprises a symmetric arrangement of barriers and wells such that the light output $\lambda^-$ is essentially identical to the light output $\lambda^+$.

5. A light source as defined in claim 1 wherein the injector region comprises an asymmetric arrangement of barriers and wells about the center point of said injector region such that the first, predetermined characteristic is different from the second, predetermined characteristic.

6. A light source as defined in claim 2 wherein the injector region comprises an asymmetric arrangement of barriers and wells about the center point of said injector region such that the first output wavelength $\lambda^-$ is not equal to the second output wavelength $\lambda^+$.

7. A light source as defined in claim 5 wherein the injector region comprises a first section of doped barriers and doped quantum wells disposed on a first side of the center point and a second section of doped barriers and doped quantum wells disposed on a second, opposite side of said center point, the thicknesses of said first section of doped barriers and doped quantum wells being different from the thicknesses of said second section of doped barriers and doped quantum wells.

8. A light source as defined in claim 5 wherein the injector region comprises a first section of doped barriers and doped quantum wells disposed on a first side of the center point and a second section of doped barriers and doped quantum wells disposed on a second, opposite side of said center point, the doping of said first section of doped barriers and doped quantum wells being different from the doping of said second section of doped barriers and doped quantum wells.

9. A light source as defined in claim 5 wherein the injector region comprises a first section of doped barriers and doped quantum wells disposed on a first side of the center point and a second section of doped barriers and doped quantum wells disposed on a second, opposite side of said center point, the thicknesses and doping of said first section of doped barriers and doped quantum wells being different from the thicknesses and doping of said second section of doped barriers and doped quantum wells.

10. Apparatus for measuring light absorption of a gaseous measurement sample at wavelengths $\lambda^-$ and $\lambda^+$ comprising a unipolar semiconductor light source according to claim 5 for directing light at wavelengths $\lambda^-$ and $\lambda^+$ into said sample and at least one optical detector for detecting light of wavelengths $\lambda^-$ and $\lambda^+$ emerging from said sample.

11. A light source as defined in claim 1 wherein the first and second active regions comprise layers of Group III–V compound semiconductors.

12. A light source as defined in claim 11 wherein the first and second active regions comprise layers of GaInAs and AlInAs.

13. A light source as defined in claim 1 wherein the light source is a QC laser.

14. A light source as defined in claim 1 wherein the light source is a QC spontaneous emission device.

15. A light source as defined in claim 1 wherein the light source is a type-II cascade laser.

16. A light source as defined in claim 1 wherein the light source is a distributed feedback laser.

* * * * *